United States Patent
Yu et al.

(10) Patent No.: US 8,921,911 B2
(45) Date of Patent: Dec. 30, 2014

(54) VERTICAL SEMICONDUCTOR CHARGE STORAGE STRUCTURE

(75) Inventors: Pin-Yuan Yu, Taichung (TW); Yi-Chun Shao, Taichung (TW); Chien-Hua Chu, Taichung (TW)

(73) Assignee: Rexchip Electronics Corporation, Taichung (TW)

( * ) Notice: Subject to any disclaimer, the term of this patent is extended or adjusted under 35 U.S.C. 154(b) by 182 days.

(21) Appl. No.: 13/609,739

(22) Filed: Sep. 11, 2012

(65) Prior Publication Data
US 2014/0071585 A1    Mar. 13, 2014

(51) Int. Cl.
*H01L 27/108* (2006.01)

(52) U.S. Cl.
USPC .... 257/306; 257/303; 257/301; 257/E27.034; 257/E27.042; 257/E27.048; 257/E27.088; 257/E27.09; 257/E27.092; 257/E21.648

(58) Field of Classification Search
USPC .......... 257/306, 303, 301, E27.034, E27.042, 257/E27.048, E27.088, E27.09, E27.092, 257/E21.648
See application file for complete search history.

(56) References Cited

U.S. PATENT DOCUMENTS

| 7,871,891 B2 * | 1/2011 | Cho et al. ............... 438/386 |
| 2007/0161185 A1 | 7/2007 | Liang |
| 2008/0002330 A1 * | 1/2008 | Park ...................... 361/311 |
| 2008/0048235 A1 | 2/2008 | Tsai |
| 2008/0145997 A1 | 6/2008 | Tu |

* cited by examiner

*Primary Examiner* — Timor Karimy
(74) *Attorney, Agent, or Firm* — Muncy, Geissler, Olds & Lowe, P.C.

(57) ABSTRACT

A vertical semiconductor charge storage structure includes a substrate, at least one lower electrode, a dielectric layer and an upper electrode. The lower electrode includes a lower conductor, and a first side conductor and a second side conductor connected to the lower conductor. The first side conductor and the second side conductor are parallel to each other and form an included angle with the lower conductor. A height of the first side conductor from the substrate is greater than a height of the second side conductor from the substrate. The dielectric layer and the upper electrode are sequentially formed on surfaces of the substrate and the lower electrode. Accordingly, by forming the first side conductor and the second side conductor at different heights, an aperture ratio is increased to reduce difficulty in filling or deposition in subsequent processes to further enhance an overall yield rate.

4 Claims, 5 Drawing Sheets

VERTICAL SEMICONDUCTOR CHARGE STORAGE STRUCTURE

FIELD OF THE INVENTION

The present invention relates to a charge storage structure, and particularly to a vertical semiconductor charge storage structure.

BACKGROUND OF THE INVENTION

A charge storage capability of a capacitor is largely dependent on a size of a dielectric constant, a distance between two conductive plates, and areas of the conductive plates. Under conditions of the unavailability of a material with a higher dielectric constant and an irreducible distance between the conductive plates, an only feasible approach for increasing the charge storage capability is expanding the areas of the conductive plates. However, under current manufacturing processes targeting at integration and miniaturization, increasing the size of elements due to the increased area of the conductive plates contradicts current requirements on circuit elements. For example, the US Publication No. 20080048235 "Capacitor Structure and Method for Preparing the Same" discloses a capacitor structure. In the above prior art, a crown-shaped capacitor structure is described for increasing relative areas between electrodes through characteristics in a shape of the crown-shaped capacitor.

To further increase relative areas between electrodes, "Method of Manufacturing Charge Storage Device" is disclosed by the US Publication No. 20070161185, and "Method of Forming a Metal-Insulator-Metal Capacitor" is disclosed by the US Publication No. 20080145997. In the above prior art, multiple insulator layers are stacked on a substrate, and an opening connecting to the substrate is disposed at the insulator layers. An etch solution etching the insulator layers in different materials at different etch rates is then utilized to laterally etch the insulator layers to form sidewalls of the opening to a plurality of recesses, thereby forming the crown-shaped capacitor structure. A capacitor process is then performed on surfaces of the sidewalls to achieve the object of increasing a sensing area of the capacitor.

The crown-shaped capacitor structure disclosed by the above prior art can be simplified to a structure shown in FIG. 1. Referring to FIG. 1, the crown-shaped capacitor structure includes a substrate 1, a lower electrode 2, and a dielectric layer 3 covering a surface of the lower electrode 2. It should be noted that a top electrode covering a surface of the dielectric layer 3 is not depicted to facilitate a clear description. The lower electrode 2 includes a bottom electrode 201 parallel to the substrate 1, and two side electrodes 202 perpendicular to the bottom electrode 201. The two side electrodes 202 are electrically connected to the bottom electrode 201 to form a so-called crown-shaped capacitor structure. The dielectric layer 3 covers surfaces of the bottom electrode 201 and the two side electrodes 202. Based on a large degree of freedom at an upper end of the side electrodes 202, a sphere 4 is formed when the dielectric layer 3 covers the upper end—such phenomenon is a natural occurrence in the manufacturing process. Due to large diameter of the sphere 4, an aperture ratio between the two side electrodes 202 is decreased. Further, the two spheres may be too close to connect with each other to seal the opening that results in difficulty in proceeding subsequent processes or even causing subsequent processes to be impracticable. Moreover, to maintain the charge storage capacity, a height of the side electrodes 202 needs to be increased to lead to a raised aspect ratio. Consequently, enhancing an overall manufacturing yield rate is made extremely challenging under such circumstances. Therefore, there is a need for a solution for overcoming the above issues.

SUMMARY OF THE INVENTION

Therefore the primary object of the present invention is to overcome issues of a small aperture ratio or even lack of opening between side electrodes that result in difficulty in proceeding subsequent processes.

To achieve the above object, a vertical semiconductor charge storage structure is provided. The vertical semiconductor charge storage structure includes a substrate, at least one lower electrode, a dielectric layer and an upper electrode. The substrate includes at least one electrical contact. The lower electrode includes a lower conductor electrically connected with the electrical contact, a first side conductor disposed at one end of the lower conductor, and a second side conductor disposed at the other end of the lower conductor. The first side conductor and the second side conductor are parallel to each other, and form an included angle with the lower conductor. Further, a height of the first side conductor from the substrate is greater than a height of the second side conductor from the substrate. The dielectric layer is formed on surfaces of the substrate and the lower electrode. The upper electrode is formed on a surface of the dielectric layer away from the substrate and the lower electrode.

Compared to the prior art, the present invention offers several advantages below. First of all, by forming an oblique opening with the first side conductor and the second side conductor having different heights, the aperture ratio is effectively increased as a width of the oblique opening is larger. Secondly, through the arrangement of the first side conductor and the second side conductor having different heights, the dielectric layer at one end away from the substrate is prevented from connecting to close the opening. Further, difficulty in proceeding subsequent deposition process is reduced by the increased aperture ratio to thereby enhance an overall yield rate.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

Figure 1:
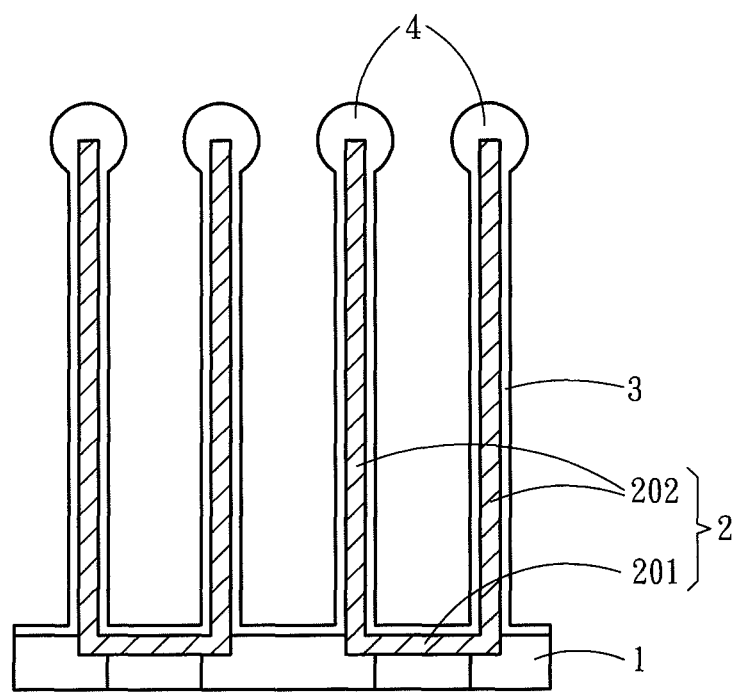
FIG. 1 is a sectional view of a conventional solution.
Figure 2:
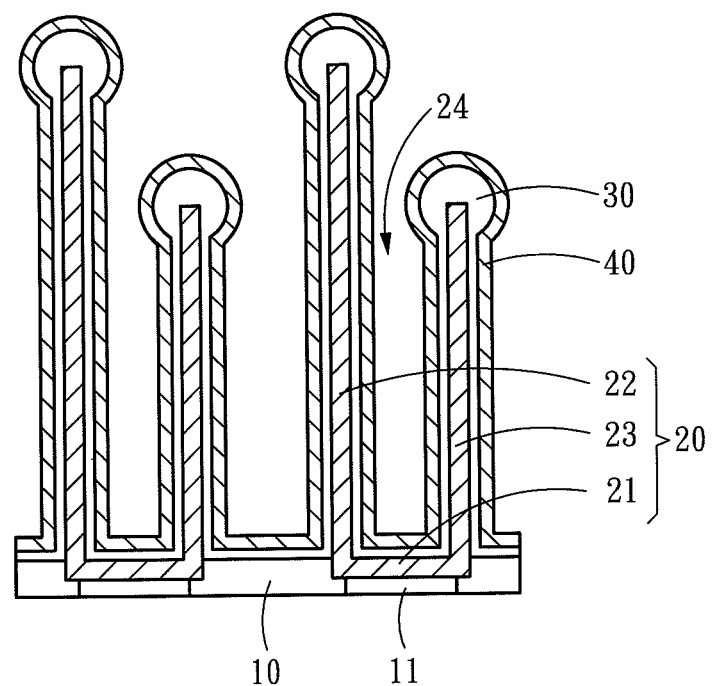
FIG. 2 is a sectional view according a preferred embodiment of the present invention.

FIG. 2 shows a vertical semiconductor charge storage structure. The vertical semiconductor charge storage structure includes a substrate 10, at least one lower electrode 20, a dielectric layer 30, and an upper electrode 40. For example, the present invention may be a dynamic random access memory (DRAM) structure, e.g., a vertical DRAM. A DRAM is taken as an example for explaining a structure in the description below. The substrate 10 has at least one electrical contact 11, and a structure below the substrate 10 includes a bit line (not shown), a transistor (not shown) and a word line (not shown). To focus on the charge storage structure of the present invention, the structure below the substrate 10 is not further described. Through the transistor cooperating with the bit line and the word line below the substrate 10, data in a charge storage element connected to the electrical contact 11 can be accessed by controlling signals of the word line and the bit line. The lower electrode 20 includes a lower conductor 21 electrically connected with the electrical contact 11, a first side conductor 22 disposed at one end of the lower conductor 21, and a second side conductor 23 disposed at the other end of the lower conductor 21. The first side conductor 22 and the second side conductor 23 are parallel to each other, and form an included angle a (as shown in FIG. 3E) with the lower conductor 21. A height of the first side conductor 22 from the substrate 10 is greater than a height of the second side conductor 23 from the substrate 10. The dielectric layer 30 is formed on surfaces of the substrate 10 and the lower electrode 20. The upper electrode 40 is formed on a surface of the dielectric layer 30 away from the substrate 10 and the lower electrode 20. The included angle a is 90 degrees, such that the first side conductor 22 and the second side conductor 23 are perpendicular to the lower conductor 21. The lower electrode 20 and the upper electrode 40 may be made of a material selected from the group consisting of titanium nitride, tantalum nitride and combination thereof. The dielectric layer 30 may be made of a material selected from the group consisting of hafnium oxide, aluminum oxide, zirconium oxide, lanthanum oxide and combinations thereof. Further, the present invention includes a plurality of electrical contacts 11 and a plurality of lower electrodes 20 corresponding to the electrical contacts 11, with the electrical contacts 11 being arranged in an array to form the DRAM structure of the present invention. Accordingly, end points with different elevations are formed based on the different heights of the first side conductors 22 and the second side conductors 23.

It should be noted that the first side conductors 22 and the second side conductors 23 are alternately arranged. That is, in the lower electrodes 20, the higher first side conductors 22 and the lower second side conductors 23 are sequentially arranged in an alternate manner. However, the present invention is not limited to the above arrangement. In an alternative embodiment, the first side conductors 22 and the second side conductors 23 of the lower electrodes 20 may also be closely arranged.

With reference to FIGS. 3A to 3G, a manufacturing process of the present invention is described below. For example, the present invention is manufactured by etching and deposition processes according to an embodiment. The manufacturing process includes the following steps.

Figure 3A:
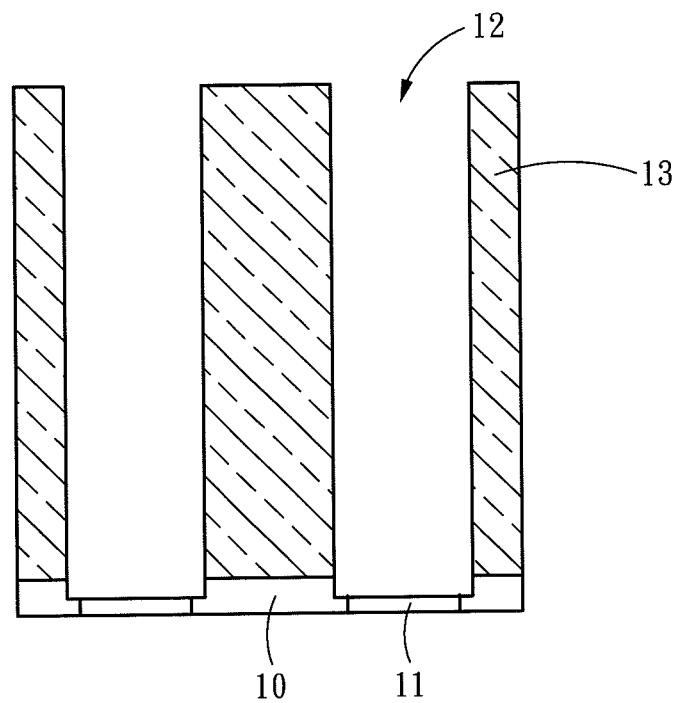
FIG. 3A to FIG. 3G are schematic diagrams of a manufacturing process according to a preferred embodiment of the present invention.

In Step S1, referring to FIG. 3A, positions of the electrical contact 11 of the substrate 10 are etched. After having manufactured the transistor below the substrate 10, an oxide is filled at the surface of the substrate 10, and dry etching or wet etching is performed on the substrate 10 through definition using a mask to form a plurality of channels 12 and columns 13 corresponding to the channels 12.

Figure 3B:
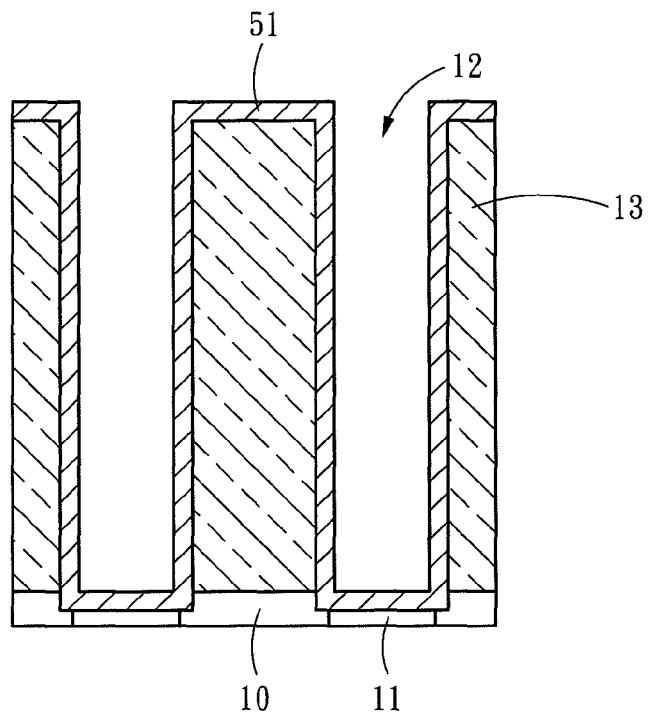

In Step S2, referring to FIG. 3B, a titanium oxide layer 51 is deposited at surfaces of the channels 12 and the columns 13.

Figure 3C:
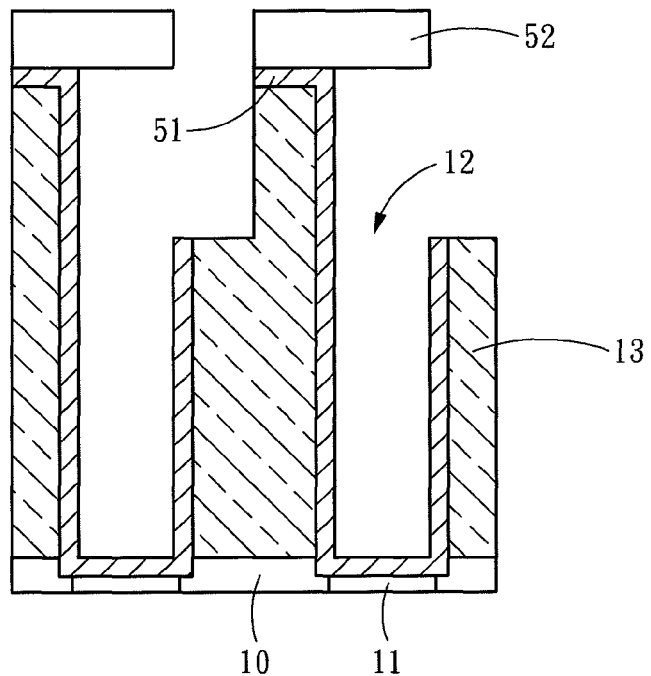

In Step S3, referring to FIG. 3C, a first etch process is performed on the titanium oxide layer 51. A shielding layer 52 is disposed at a position of a part of the column 13 and the corresponding channel 12, and the etch process is performed. Due to the shielding of the shielding layer 52, the titanium oxide layer 51 located on the column 13 is jointly removed with a part of the column 13. More specifically, the titanium oxide layer 52 and the columns 13 located at the etched positions and unshielded by the shielding layer 51 are removed, such that the titanium oxide layer 52 and the columns 13 are disconnected by the etched positions to become electrically unconnected. That is, the titanium oxide layer 52 is disconnected at the etched position, and the column 13 is also disconnected at the etched position.

Figure 3D:
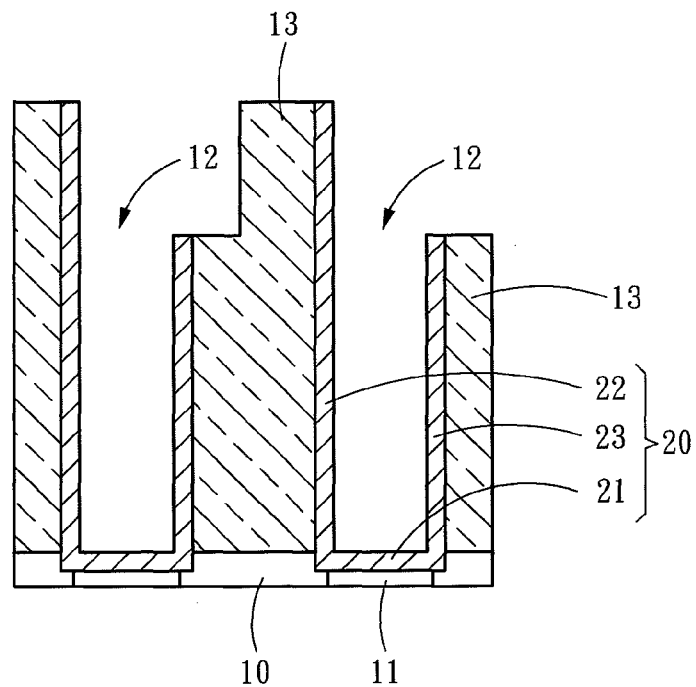
Figure 3E:
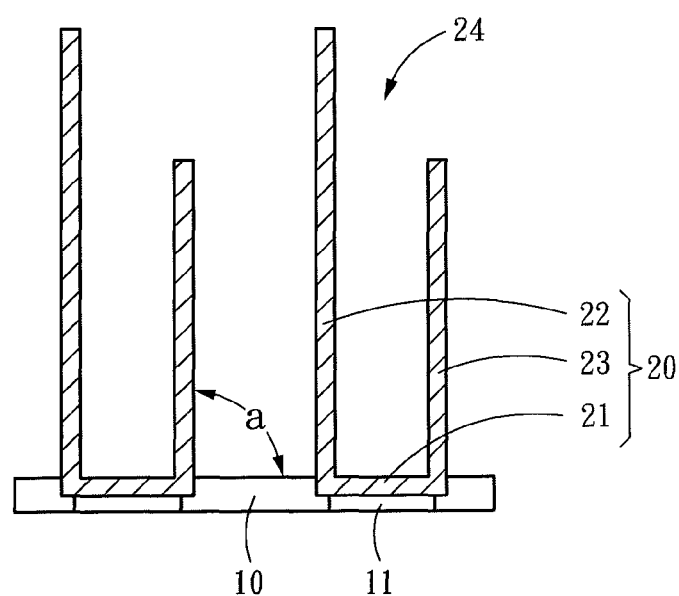

In Step S4, referring to FIG. 3D, a second etch process is performed on the titanium oxide layer 51. By a back-etch process, the titanium oxide layer 51 on the surface away from the substrate 10 is removed to form the lower electrode 20.

In Step S5, referring to FIG. 3E, only the lower electrode 20 is kept. For example, the oxide can be removed by wet etching to leave the lower electrode 20 corresponding to the electrical contact 11. Thus, the lower electrode 20 includes the lower conductor 21, the first side conductor 22 and the second side conductor 23. The height of the first side conductor 22 from the substrate 10 is greater than the height of the second side conductor 23 from the substrate 10, so as to accordingly form an oblique opening 24 between the first side conductor 22 and the second side conductor 23. Base on trigonometry, it is a known fact that a length of a slanted side is greater than any of two other remaining sides. Therefore, the aperture ratio is effectively increased by use of the oblique opening 24.

Figure 3F:
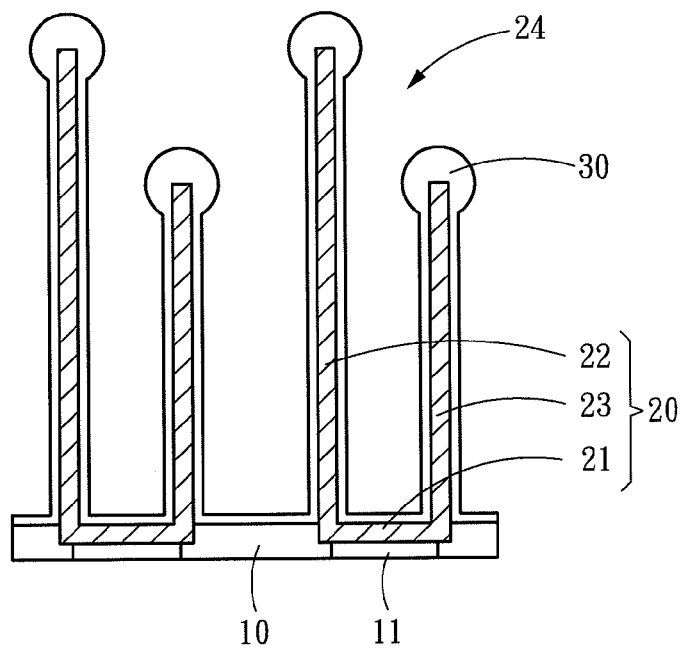

In Step S6, referring to FIG. 3F, the dielectric layer 30 is formed on the surfaces of the substrate 10 and the lower electrode 20. In contribution to the increased aperture ratio, the dielectric layer 30 is allowed to more easily form at the surface of the lower electrode 20, and more particularly at the surface of the lower conductor 21.

Figure 3G:
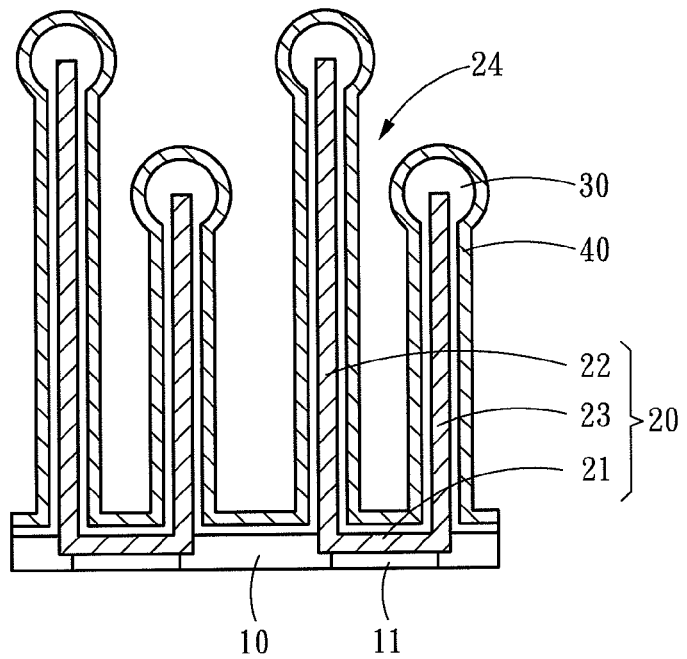

In Step S7, referring to FIG. 3G, the upper electrode 40 is formed on the surface of the dielectric layer 30 to form a metal-insulator-metal (MIM) structure for serving as a capacitor.

Therefore, the present invention offers several advantages below. First of all, by forming the oblique opening with the first side conductor and the second side conductor having different heights, the aperture ratio is effectively increased as a width of the oblique opening is larger. Secondly, through the arrangement of the first side conductor and the second side conductor having different heights, the dielectric layer at one end away from the substrate is prevented from connecting to close the opening. Further, difficulty in proceeding subsequent deposition process is reduced by the increased aperture ratio to thereby enhance an overall yield rate.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A vertical semiconductor charge storage structure, comprising:
 a substrate, including a plurality of electrical contacts arranged in an array;
 a plurality of lower electrodes respectively corresponding to and electrically connecting to the plurality of contacts, each of the plurality of lower electrodes comprising a lower conductor electrically connected with the at least one electrical contact, a first side conductor disposed at one end of the lower conductor, and a second side conductor disposed at another end of the lower conductor;
 wherein the first side conductors and the second side conductors are interlaced and parallel to each other and form an included angle with the lower conductor;
 wherein the first side conductors are formed at a height greater than that of the second side conductors;

a dielectric layer, formed on surfaces of the substrate and the plurality of lower electrodes; and an upper electrode, formed on a surface of the dielectric layer away from the substrate and the plurality of lower electrodes.

2. The vertical semiconductor charge storage structure of claim 1, wherein the included angle is 90 degrees to allow the first side conductor and the second side conductor perpendicular to the lower conductor.

3. The vertical semiconductor charge storage structure of claim 1, wherein the lower electrode and the upper electrode are made of a material selected from the group consisting of titanium nitride, tantalum nitride and combination thereof.

4. The vertical semiconductor charge storage structure of claim 1, wherein the dielectric layer is made of a material selected from the group consisting of hafnium oxide, aluminum oxide, zirconium oxide, lanthanum oxide and combinations thereof.

* * * * *